United States Patent [19]

Ushiku

[11] Patent Number: 4,587,549
[45] Date of Patent: May 6, 1986

[54] MULTILAYER INTERCONNECTION STRUCTURE FOR SEMICONDUCTOR DEVICE

[75] Inventor: Yukihiro Ushiku, Yokohama, Japan

[73] Assignee: Tokyo Shibaura Denki Kabushiki Kaisha, Kawasaki, Japan

[21] Appl. No.: 482,783

[22] Filed: Apr. 7, 1983

[30] Foreign Application Priority Data

Jun. 4, 1982 [JP] Japan .................................. 57-96032

[51] Int. Cl.$^4$ ................... H01L 21/283; H01L 23/18; H01L 21/94
[52] U.S. Cl. ......................................... 357/71; 357/68
[58] Field of Search .................... 357/71, 68

[56] References Cited

U.S. PATENT DOCUMENTS

| 3,436,611 | 4/1969 | Perry | 357/68 |
| 3,436,616 | 4/1969 | Jarrad | 357/71 |
| 4,115,795 | 9/1978 | Masuoka et al. | 357/71 P |
| 4,185,294 | 1/1980 | Sumitomo et al. | 357/71 |
| 4,348,746 | 9/1982 | Okabayashi et al. | 357/71 S |
| 4,412,239 | 10/1983 | Iwasaki et al. | 357/71 P |
| 4,419,682 | 12/1983 | Masuoka | 357/71 P |

FOREIGN PATENT DOCUMENTS

| 0028280 | 3/1977 | Japan | 357/71 S |
| 52-55379 | 5/1977 | Japan . | |
| 57-73940 | 5/1982 | Japan . | |
| 2073951 | 10/1981 | United Kingdom | 357/71 |

Primary Examiner—Andrew J. James
Assistant Examiner—S. V. Clark
Attorney, Agent, or Firm—Oblon, Fisher, Spivak, McClelland & Maier

[57] ABSTRACT

A multilayer interconnection structure for a semiconductor device has interconnection layers superposed on each other on the surface of a semiconductor substrate with an insulating layer interposed therebetween. Connection between the desired interconnection layers or between the desired interconnection layer and semiconductor substrate is effected by means of a contact hole formed in the respective insulating layers. Two upper and lower interconnection layers intersect each other above the contact holes, and the contact hole does not overlap part of the traverse region of the upper interconnection layer in the intersecting section.

2 Claims, 5 Drawing Figures

MULTILAYER INTERCONNECTION STRUCTURE FOR SEMICONDUCTOR DEVICE

BACKGROUND OF THE INVENTION

1. Field of the Invention

This invention relates to an improvement on a multilayer interconnection structure for a semiconductor device and more particularly to an improvement on a contact hole pattern of said semiconductor device.

2. Description of the Prior Art

In recent years, noticeable progress has been achieved in the semiconductor-manufacturing technique, particularly in the technique of forming a multilayer interconnection structure for a semiconductor device, for example, not only a 2-ply or 3-ply type, but also a 4 or more ply type. An enlarged number of interconnection layers, however, leads to the difficulties that the step configuration on the surface of the semiconductor structure is increasingly complicated, giving rise to the deterioration of wiring characteristics and reduced reliability of wiring caused by, for example, breakage. It has hitherto been generally accepted and regarded as advantageous to enlarged as much as possible the contact hole used for connection between the desired interconnection layers. However, the enlargement of the contact hole is accompanied with the undermentioned drawbacks.

FIG. 1 is a plan view of the conventional multilayer interconnection structure. FIG. 2 is a sectional view along line A—A of FIG. 1. As seen from FIG. 2, a first interconnection layer 2 consisting of an impurity region is formed in the surface portion of a semiconductor substrate 1. A first insulating layer 3 is deposited on said surface. A contact hole 4 is bored in the that part of the first insulating layer 3 which contacts the surface of the first interconnection layer 2. A second interconnection layer 5 prepared from aluminium is formed on the surface of the first insulating layer 3. This second interconnection layer 5 is connected to the first interconnection layer 2 by means of the contact hole 4. To ensure connection between the first and second interconnection layers 2, 5, the contact hole 4 is relatively enlarged in that region where the first and second interconnection layers 2, 5 are superposed on each other, and extended along the second interconnection layer 5. A second insulating layer 6 is mounted on the first insulating layer 3 and second interconnection layer 5. A third interconnection layer 7 is laid on the second insulating layer 6. This third interconnection layer 7 intersects the second interconnection layer 5 and passes over the contact hole 4.

The conventional multilayer interconnection structure constructed as described above has the drawbacks that as seen from FIG. 2, a stepped portion of the second insulating layer 6 which is defined by the surface shape of the first insulating layer 3 above the contact hole 4 causes the third interconnection layer 7 to cover the second insulating layer 6 with less reliability. In other words, the third interconnection layer 7 is much thinner in the above-mentioned stepped portion of the second insulating layer 6. Consequently, the conventional multilayer interconnection structure has the drawbacks that the third interconnection layer 7 tends to disconnect in the aforesaid stepped portion of the second insulating layer 6; wiring characteristics are deteriorated by, for example, increased wiring resistance; and electro-migration arises particularly in the thinned portion of the third interconnection layer 7, resulting in a decline in the reliability of a multilayer interconnection structure for a semiconductor device.

SUMMARY OF THE INVENTION

It is accordingly the object of this invention to provide a novel multilayer interconnection structure for a semiconductor device which prevents an interconnection layer from being broken even by its passage over a stepped portion formed above a contact hole and suppresses an increase in wiring resistance, thereby assuring an improvement in the characteristics and reliability of a multilayer interconnection structure.

To attain the above-mentioned object, this invention provides a novel multilayer interconnection structure for a semiconductor device which comprises:

a plurality of interconnection layers provided on the surface of a semiconductor substrate in a state superposed on each other with an insulating layer interposed between said interconnection layers, and wherein connection is effected between the desired ones of the interconnection layers or between the desired interconnection layer and semiconductor substrate by means of a contact hole formed in the respective insulating layers; and the intersecting portions of two interconnection layers are positioned above the contact hole.

A multilayer interconnection structure embodying this invention is characterized in that the contact hole does not overlap part of the traverse region of the upper interconnection layer in the intersecting section.

A novel multilayer interconnection structure embodying this invention has the advantages that a contact hole does not overlap part of that portion of an upper interconnection layer which is set above the contact hole; said portion passes over a region free from a stepped portion defined by the contact hole, thereby suppressing the disconnection of the interconnection layer and the increased resistance of wiring; and improvement is assured on the characteristics and reliability of a multilayer interconnection structure, thereby prominently increasing the application of said structure to the technical field of a semiconductor device.

DETAILED DESCRIPTION OF THE PREFERRED EMBODIMENTS

Figure 1:
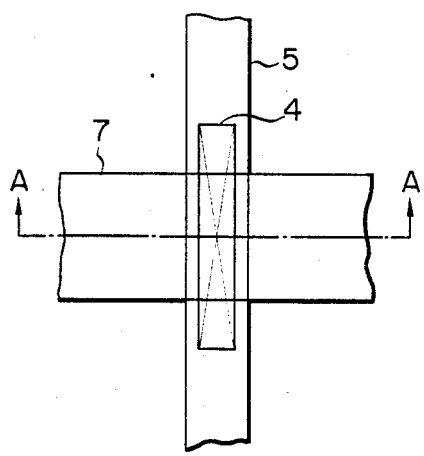
FIG. 1 is a plan view of the conventional multilayer interconnection structure for a semiconductor device.
Figure 3:
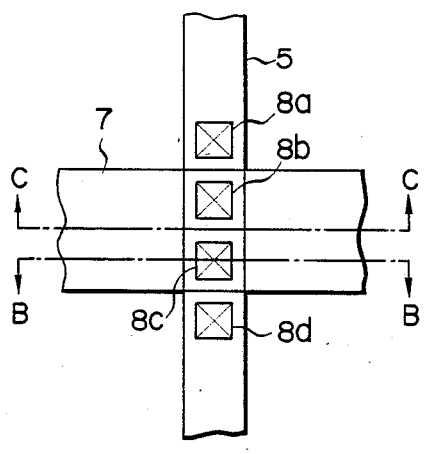
FIG. 3 is a plan view of a multilayer interconnection structure according to a first embodiment of this invention.

Description will now be given with reference to FIG. 3 of a multilayer interconnection structure according to a first embodiment of this invention. The parts of FIG. 3 the same as those of FIG. 1 are denoted by the same numerals, description thereof being omitted. The structure of FIG. 3 is different from that of FIG. 1 in that in the conventional multilayer interconnection structure, a single contact hole 4 is drilled in a state to cross the whole width of a third interconnection layer 7, while in the multilayer interconnection structure embodying this invention, a plurality of divided contact holes 8a, 8b, 8c, 8d are provided below the third interconnection layer 7. In other words, four small contact holes 8a, 8b, 8c, 8d are linearly drilled in the first insulating film 3 along the second interconnection layer 5.

Figure 2:
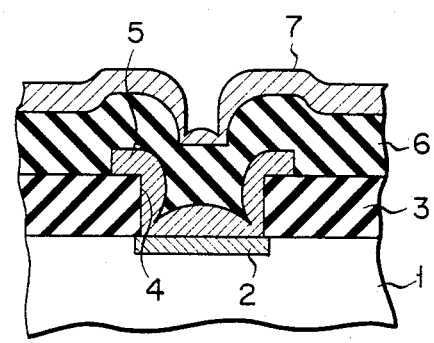
FIG. 2 is a sectional view along line A—A of FIG. 1.
Figure 4:
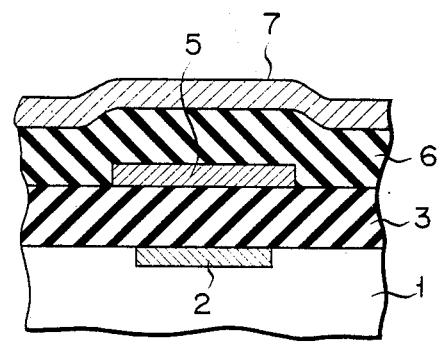
FIG. 4 is a cross-sectional view along line C—C of FIG. 3.

In the multilayer interconnection structure arranged as described above, part of the traverse region of the third interconnection layer 7 in that section which intersects the second interconnection layer 5 does not overlap the contact holes 8a, 8b, 8c, 8d. Therefore, the above-mentioned portion of the third interconnection layer 7 passes a region free from any stepped portion. In this case, the section along line B—B of FIG. 3 indicates the same pattern as that of FIG. 2. Namely, the third interconnection layer 7 overlap the contact hole 8c and cross a stepped portion. In the section along line C—C of FIG. 3, however, the third interconnection layer 7 does not overlap any of the contact holes. As shown in FIG. 4, therefore, the third interconnection layer 7 crosses a step-free region. Accordingly, the embodiment of FIG. 3 offers the advantages that it is possible to suppress the disconnection of a third interconnection layer 7 in the stepped portion, and the cutting of wiring and increased wiring resistance caused by the reduced thickness of the thus interconnection layer 7, thereby assuring improvement in the characteristics and reliability of a multilayer interconnection structure.

The characteristics of connection between adjacent interconnection layers through an intervening contact hole are governed not only by the area of the contact hole but also its peripheral length. In the embodiment of FIG. 3, a plurality of contact holes collectively occupy a smaller area than in the conventional multilayer interconnection structure, but the total length of their peripheries is more enlarged. Therefore, the characteristics of the commmunication between adjacent interconnection layers deteriorate little.

Figure 5:
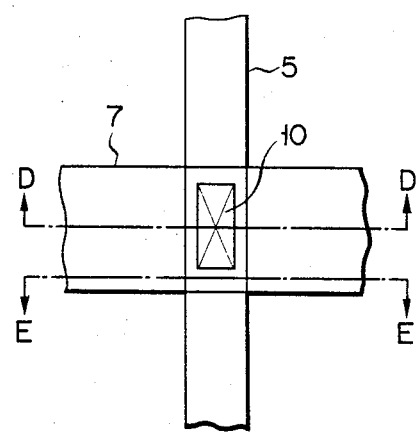
FIG. 5 is a plan view of a multilayer interconnection structure according to a second embodiment of the invention.

Description will now be given with reference to FIG. 5 of a multilayer interconnection structure according to a second embodiment of this invention. Referring to FIG. 5 showing the plan view of said structure, a contact hole 10 extending along the second interconnection layer 5 has a smaller length than the width of a third interconnection layer 7. In a section along line D—D of FIG. 5, therefore, the third interconnection layer 7 overlaps the contact hole 10 and crosses a stepped portion defined by said contact hole 10. In a section along line E—E of FIG. 5, however, the third interconnection layer 7 does not overlap the contact hole 10, and passes a step-free region. Therefore, the second embodiment of FIG. 5 has the same advantages as the first embodiment of FIG. 3.

In the arrangement of FIG. 5, the contact hole 10 has a smaller area and a shorter peripheral length than in the conventional multilayer interconnection structure, somewhat reducing the connection characteristics between the adjacent interconnection layers. However, no practical difficulties are raised by the embodiment of FIG. 5.

With a multilayer interconnection structure embodying this invention, the interconnection layer and contact portion are prepared from aluminium, polysilicon, or refractory metal silicide.

It will be noted that this invention is not limited to the aforementioned embodiments, but is applicable with various changes and modifications without departing from the scope and object of the invention. Further, the number of contact holes need not be limted to four as previously described, but may be varied. There may also be more than three interconnection layers. The foregoing embodiments refer to the case where the substrate and the interconnection layer were connected together through a contact hole formed in the first insulating film. However, it will be noted that this invention is not limited to said embodiment, but is applicable to the case where any selected interconnection layers are connected together through a through hole formed in an insulating film interposed between said interconnection layers. Throughout the specification of this invention, it should be understood that the form "contact hole" is defined to include a through hole.

What is claimed is:

1. A multilayer interconnection structure for a semiconductor device comprising:
   a semiconductor substrate;
   at least three interconnecting layers and at least two insulating layers deposited on the surface of said substrate with each one of said insulating layers being interposed between adjacent ones of said interconnecting layers;
   connection means including a plurality of contact holes formed in at least a first one of said at least two insulating layers in order to insure a desired connection between a first and a second of said at least three interconnecting layers wherein said first and second layers are separated by said first insulating layer; and
   wherein said second interconnecting layer and a third one of said at least three interconnecting layers are spaced from each other by a second one of said at least two insulating layers such that the projection of said third interconnecting layer onto said second interconnecting layer defines an intersecting area above at least one of said plurality of contact holes with the cross-sectional area of said at least one of said contact holes being less than said intersecting area and wherein at least another one of said plurality of contact holes does not have said intersecting area located above it.

2. The multilayer interconnection structure according to claim 1 wherein said first of said at least three interconnecting layers provides an electrical connection with said substrate.

* * * * *